(12) United States Patent
Chua et al.

(10) Patent No.: US 12,340,978 B2
(45) Date of Patent: *Jun. 24, 2025

(54) SYMMETRIC AND IRREGULAR SHAPED PLASMAS USING MODULAR MICROWAVE SOURCES

(71) Applicant: Applied Materials, Inc., Santa Clara, CA (US)

(72) Inventors: Thai Cheng Chua, Cupertino, CA (US); Farzad Houshmand, Mountain View, CA (US); Christian Amormino, San Jose, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/921,716

(22) Filed: Jul. 6, 2020

(65) Prior Publication Data

US 2020/0402769 A1 Dec. 24, 2020

Related U.S. Application Data

(63) Continuation of application No. 15/485,217, filed on Apr. 11, 2017, now Pat. No. 10,707,058.

(51) Int. Cl.
*H01J 37/32* (2006.01)
(52) U.S. Cl.
CPC .... *H01J 37/32266* (2013.01); *H01J 37/3222* (2013.01); *H01J 37/32238* (2013.01); *H01J 37/32247* (2013.01); *H01J 37/3299* (2013.01)
(58) Field of Classification Search
USPC .................................................. 156/345.41
See application file for complete search history.

(56) References Cited

U.S. PATENT DOCUMENTS

| 3,403,405 A | * | 9/1968 | Barrar | ...................... H01Q 1/10 343/901 |
| 5,134,965 A | | 8/1992 | Tokuda et al. | |

(Continued)

FOREIGN PATENT DOCUMENTS

| CN | 1652661 | 8/2005 |
| CN | 102089867 | 6/2011 |

(Continued)

OTHER PUBLICATIONS

Machine Translation JP2013171847, Fujino et al.(Year: 2013).*

(Continued)

*Primary Examiner* — Ram N Kackar
(74) *Attorney, Agent, or Firm* — Schwabe, Williamson & Wyatt, P.C.

(57) ABSTRACT

Embodiments include a plasma processing tool that includes a processing chamber, and a plurality of modular microwave sources coupled to the processing chamber. In an embodiment, the plurality of modular microwave sources include an array of applicators that are positioned over a dielectric body that forms a portion of an outer wall of the processing chamber. The array of applicators may be coupled to the dielectric body. Additionally, the plurality of modular microwave sources may include an array of microwave amplification modules. In an embodiment, each microwave amplification module may be coupled to at least one of the applicators in the array of applicators. According to an embodiment, the dielectric body be planar, non-planar, symmetric, or non-symmetric. In yet another embodiment, the dielectric body may include a plurality of recesses. In such an embodiment, at least one applicator may be positioned in at least one of the recesses.

20 Claims, 12 Drawing Sheets

(56) References Cited

U.S. PATENT DOCUMENTS

| | | | |
|---|---|---|---|
| 5,179,264 A | 1/1993 | Cuomo et al. | |
| 5,180,436 A | 1/1993 | Ueda et al. | |
| 5,961,871 A | 10/1999 | Bible et al. | |
| 6,109,208 A | 8/2000 | Tsuchihashi et al. | |
| 6,158,383 A | 12/2000 | Watanabe et al. | |
| 6,204,603 B1 | 3/2001 | Spitzi et al. | |
| 6,263,830 B1 | 7/2001 | Kamarehi et al. | |
| 6,358,361 B1 | 3/2002 | Matsumoto | |
| 6,741,944 B1 | 5/2004 | Verdeyen et al. | |
| 8,308,898 B2 | 11/2012 | Kasai et al. | |
| 9,245,741 B2 | 1/2016 | Karakawa | |
| 9,281,154 B2 | 3/2016 | Ikeda et al. | |
| 9,478,410 B2 | 10/2016 | Kamada et al. | |
| 2004/0007983 A1 | 1/2004 | Sirkis et al. | |
| 2004/0011465 A1 | 1/2004 | Matsumoto et al. | |
| 2005/0173069 A1 | 8/2005 | Tolmachev et al. | |
| 2005/0195119 A1* | 9/2005 | Gaucher | H01Q 9/0421 343/702 |
| 2005/0259010 A1* | 11/2005 | Soutome | H01Q 9/40 343/702 |
| 2006/0081624 A1 | 4/2006 | Takada et al. | |
| 2006/0137613 A1* | 6/2006 | Kasai | H01J 37/3222 118/723 ME |
| 2009/0120581 A1* | 5/2009 | Qin | H01J 37/32935 156/345.24 |
| 2009/0131926 A1* | 5/2009 | Rusin | A61B 18/18 606/33 |
| 2009/0194508 A1 | 8/2009 | Ui et al. | |
| 2010/0074807 A1 | 3/2010 | Bulkin et al. | |
| 2011/0061814 A1 | 3/2011 | Ikeda | |
| 2011/0150719 A1* | 6/2011 | Ikeda | H05H 1/46 422/186 |
| 2011/0174778 A1 | 7/2011 | Sawada et al. | |
| 2011/0195201 A1 | 8/2011 | Zhu et al. | |
| 2013/0284370 A1 | 10/2013 | Collins et al. | |
| 2014/0002196 A1 | 1/2014 | Leek | |
| 2014/0197761 A1 | 7/2014 | Grandemenge et al. | |
| 2014/0262042 A1 | 9/2014 | Funk et al. | |
| 2014/0283780 A1 | 9/2014 | Smith et al. | |
| 2015/0007774 A1 | 1/2015 | Iwasaki et al. | |
| 2015/0144265 A1 | 5/2015 | Fujino et al. | |
| 2015/0206778 A1 | 7/2015 | Shimomura | |
| 2015/0211124 A1 | 7/2015 | Nozawa et al. | |
| 2015/0232993 A1 | 8/2015 | Iwao et al. | |
| 2015/0279627 A1 | 10/2015 | Iwaskaki et al. | |
| 2015/0371828 A1 | 12/2015 | Stowell | |
| 2016/0189950 A1 | 6/2016 | Oyama et al. | |
| 2016/0276139 A1* | 9/2016 | Osada | H01J 37/32256 |
| 2016/0322218 A1 | 11/2016 | Fukiage et al. | |
| 2017/0133202 A1 | 5/2017 | Berry, III | |
| 2018/0127880 A1 | 5/2018 | Kotani et al. | |
| 2018/0218883 A1 | 8/2018 | Iwao | |
| 2018/0277339 A1 | 9/2018 | Kaneko et al. | |

FOREIGN PATENT DOCUMENTS

| | | |
|---|---|---|
| CN | 104851771 | 8/2015 |
| CN | 107852805 | 3/2018 |
| CN | 109564843 | 4/2019 |
| JP | 2004266268 A | 9/2004 |
| JP | 2006-287817 | 10/2006 |
| JP | 2010-074154 | 4/2010 |
| JP | 2010-087227 | 4/2010 |
| JP | 2010-170974 | 8/2010 |
| JP | 2013-045551 | 3/2013 |
| JP | 2013-077441 | 4/2013 |
| JP | 2013-143448 | 7/2013 |
| JP | 201317847 | * 9/2013 |
| JP | 2014154421 A | 8/2014 |
| JP | 2015-135782 | 7/2015 |
| KR | 10-2002-0033193 | 5/2002 |
| KR | 10-2011-0018431 | 2/2011 |
| KR | 10-2012-0020116 | 3/2012 |
| KR | 10-2015-0098199 | 8/2015 |
| KR | 1020170015161 A | 2/2017 |
| TW | 2013/06080 | 2/2013 |
| TW | 2015/01573 | 1/2015 |
| WO | WO 2008/013112 | 12/2009 |
| WO | WO 2013/049694 | 4/2013 |
| WO | WO 2013/114870 | 8/2013 |
| WO | WO 2013/122043 | 8/2013 |
| WO | WO 2014/017132 | 1/2014 |
| WO | WO 2016/089424 | 6/2016 |

OTHER PUBLICATIONS

First Office Action from Chinese Patent Application No. 201880030817 dated Jul. 19, 2021, 13 pgs.

Notice of Reasons for Rejection from Japanese Patent Application No. 2019-555485 dated Mar. 26, 2021, 11 pgs.

Preliminary Rejection from Korean Patent Application No. 10-2019-7032706 dated Oct. 26, 2020, 9 pgs.

Preliminary Rejection from Korean Patent Application No. 10-2021-7014198 dated Jun. 1, 2021, 9 pgs.

Notice of Reasons for Rejection from Japan Patent Application No. 2019-555485 dated Oct. 7, 2020, 11 pgs.

Official Letter from Taiwan Patent Application No. 110101077 dated Jan. 17, 2022, 10 pgs.

Notice of Second Office Action from Chinese Patent Application No. 201880030817.X dated Feb. 22, 2022, 13 pgs.

Official Letter from Taiwan Patent Application No. 110101077 dated Sep. 26, 2022, 13 pgs.

International Search Report and Written Opinion from PCT/US2017/013984 mailed May 1, 2017, 7 pgs.

International Search Report and Written Opinion from PCT/US2018/022044 mailed Jun. 29, 2018, 11 pgs.

International Search Report and Written Opinion from PCT/US2018/026330 mailed Jul. 26, 2018, 12 pgs.

Non-Final Office Action from U.S. Appl. No. 15/238,695 mailed Jan. 25, 2019, 30 pgs.

International Preliminary Report on Patentability from PCT/US2017/013984 mailed Feb. 19, 2019, 8 pgs.

Non-Final Office Action from U.S. Appl. No. 15/485,217 dated May 15, 2019, 23 pgs.

Non-Final Office Action from U.S. Appl. No. 15/238,695 mailed Jul. 5, 2019, 25 pgs.

International Preliminary Report on Patentability from PCT/US2018/022044 dated Oct. 24, 2019, 8 pgs.

Final Office Action from U.S. Appl. No. 15/485,217 dated Oct. 30, 2019, 20 pgs.

International Preliminary Report on Patentability from PCT/US2018/026330 dated Nov. 21, 2019, 9 pgs.

Official Letter from Taiwan Patent Application No. 107109422 dated Aug. 25, 2020, 11 pgs.

Official Letter from Taiwan Patent Application No. 110101077 dated May 29, 2023, 12 pgs.

Office Action from Taiwan Patent Application No. 110101077 dated Jun. 3, 2024, 12 pgs.

* cited by examiner

SYMMETRIC AND IRREGULAR SHAPED PLASMAS USING MODULAR MICROWAVE SOURCES

CROSS-REFERENCE TO RELATED APPLICATIONS

This application is a continuation of U.S. patent application Ser. No. 15/485,217, filed on Apr. 11, 2017, the entire contents of which are hereby incorporated by reference herein.

BACKGROUND

1) Field

Embodiments relate to the field of microwave plasma sources and, in particular, to the formation of symmetric and/or irregular shaped plasmas using modular microwave plasma sources.

2) Description of Related Art

Plasma processing is used extensively in the manufacture of many different technologies, such as those in the semiconductor industry, display technologies, microelectromechanical systems (MEMS), and the like. Currently, radio frequency (RF) generated plasmas are most often used. However, plasmas generated with a microwave source allow for denser plasmas and/or plasmas with a high concentration of excited neutral species. Unfortunately, plasmas generated with a microwave source also suffer their own drawbacks.

Typical microwave plasma systems use a singular, large source of microwave radiation (typically a magnetron) and a transmission path for guiding the microwave radiation from the magnetron to the processing chamber. For typical high power applications in the semiconductor industry, the transmission path is a microwave waveguide. Waveguides are used because outside of a waveguide designed to carry the specific frequency of the microwave source, the microwave power attenuates rapidly with distance. Additional components, such as tuners, couplers, mode transformers, and the like are also required to transmit the microwave radiation to the processing chamber. These components limit the construction to large systems (i.e., at least as large as the sum of the waveguide and associated components), and severely limit the design. As such the geometry of the plasma that may be produced is constrained since the geometry of the plasma resembles the shape of the waveguides.

In such microwave sources, the size of the microwave plasma source is limited to a dimensions that is equal to or larger than half the wave length (i.e., $\lambda/2$) of the microwave radiation. The dimensions of the microwave plasma sources can only be in multiples of a half wavelength (i.e., $N\lambda/2$, where N is equal to any positive integer) of the microwave radiation to produce a stable microwave plasma. At 2.45 GHz, the wavelength of the microwave is at 12.25 cm in air or vacuum. As such, the dimension of the plasma has to be in multiples of 6.125 cm. Accordingly, the microwave plasma sources are limited to certain symmetrical geometric shape and sizes, and limits where a microwave plasma sources may be used.

Accordingly, it is difficult to match the geometry of the plasma to the geometry of the substrate that is being processed. In particular, it is difficult to create a microwave plasma where the plasma is generated over the entire surface of the wafer of larger substrates (e.g., 300 mm or greater wafers). Some microwave generated plasmas may use a slot line antenna to allow the microwave energy to be spread over an extended surface. However, such systems are complicated, require specific geometry, and are limited in the power density that can be coupled to the plasma.

Furthermore, microwave sources typically generate plasmas that are not highly uniform and/or are not able to have a spatially tunable density. Particularly, the uniformity of the plasma source is dependent on the modes of the standing wave pattern of the microwave with respect to the particular geometry of the microwave cavity or antenna. Thus, the uniformity is determine mainly by the geometry of the design and is not tunable. As the substrates that are being processed continue to increase in size, it becomes increasingly difficult to account for edge effects due to the inability to tune the plasma. Additionally, the inability to tune the plasma limits the ability to modify processing recipes to account for incoming substrate nonuniformity and adjust the plasma density for processing systems in which a nonuniformity is required to compensate for the design of the processing system (e.g., to accommodate the nonuniform radial velocity of the rotating wafers in some processing chambers).

SUMMARY

Embodiments include a plasma processing tool that includes a processing chamber, and a plurality of modular microwave sources coupled to the processing chamber. In an embodiment, the plurality of modular microwave sources include an array of applicators that are positioned over a dielectric body that forms a portion of an outer wall of the processing chamber. The array of applicators may be coupled to the dielectric body. Additionally, the plurality of modular microwave sources may include an array of microwave amplification modules. In an embodiment, each microwave amplification module may be coupled to at least one of the applicators in the array of applicators.

According to an embodiment, the dielectric body be planar or non-planar. In an embodiment, the dielectric body may by symmetric or non-symmetric. In yet another embodiment, the dielectric body may include a plurality of recesses. In such an embodiment, at least one applicator may be positioned in at least one of the recesses.

In an additional embodiment, the applicators may include a dielectric resonant cavity, an applicator housing formed around an outer sidewall of the dielectric resonant cavity, a monopole extending down an axial center of the dielectric resonator and into a channel formed in the center of the dielectric resonant cavity. Embodiments may also include microwave amplification modules that include a pre-amplifier, a main power amplifier, a power supply electrically coupled to the pre-amplifier, and the main power amplifier, and a circulator.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Figure 1:
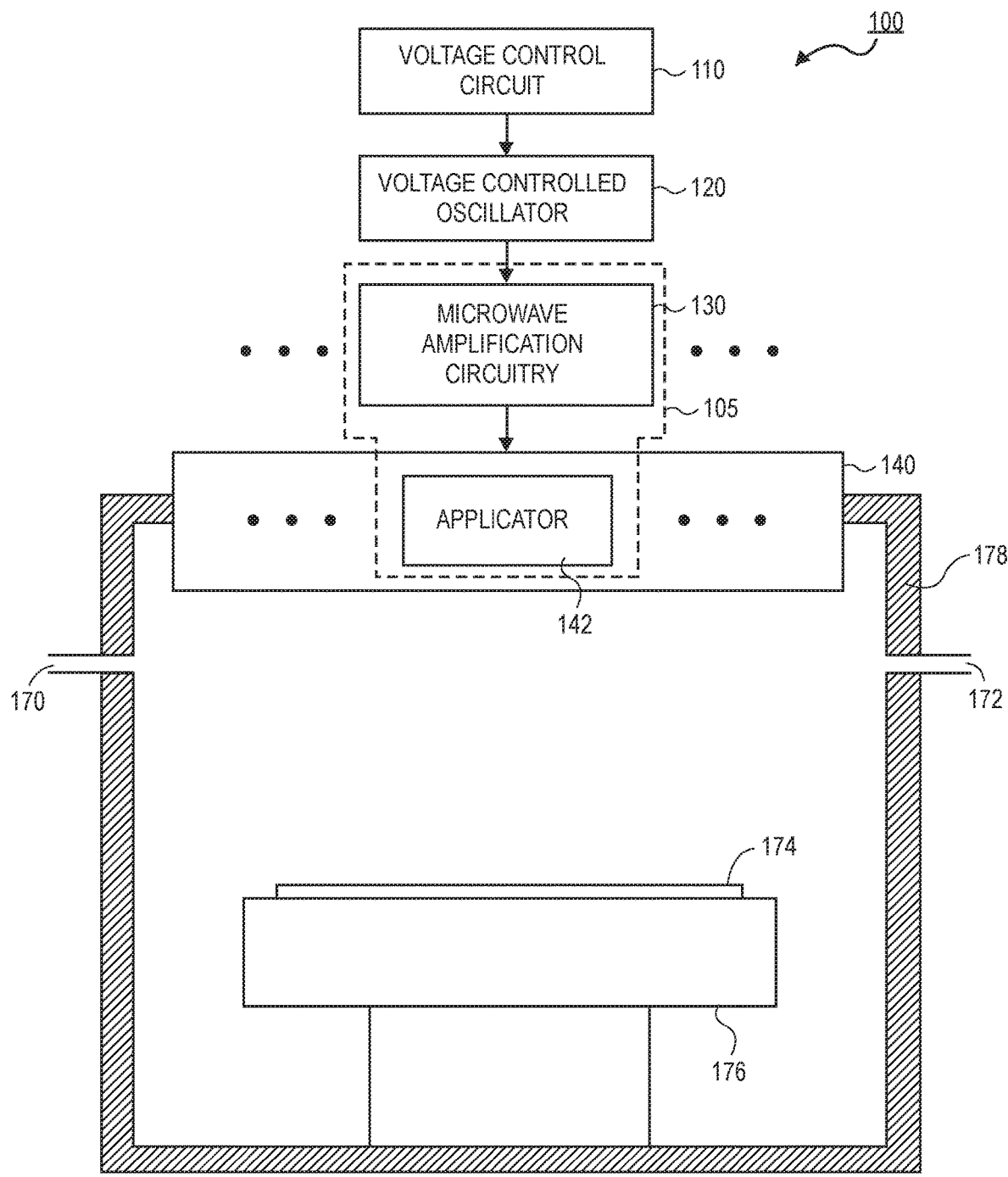
FIG. 1 is a schematic diagram of a plasma processing tool that includes a modular microwave plasma source, in accordance with an embodiment.

Devices that include one or more modular microwave plasma sources are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Embodiments include a microwave source that comprises one or more microwave modules. According to an embodiment, each microwave module comprises a microwave solid state electronics portion and an applicator portion. In an embodiment, the applicator portion may be a dielectric resonator.

The use of solid state electronics instead of a magnetron allows for a significant reduction in the size and the complexity of the plasma source. Particularly, the solid state components are much smaller than the magnetron hardware described above. Additionally, the use of a distributed arrangement employing solid state components allows for the elimination of bulky waveguides needed to transmit the microwave radiation to the processing chamber. Instead, the microwave radiation may be transmitted with coaxial cabling. The elimination of waveguides also allows for the construction of a large area microwave source where the size of the plasma formed is not limited by the size of waveguides. Instead, an array of microwave modules may be constructed in a given pattern that allows for the formation of a plasma that is arbitrarily large (and arbitrarily shaped) to match the shape of any substrate. For example, the applicators of the microwave modules may be arranged on (or partially embedded within) dielectric bodies that are any desired shape, (e.g., symmetric plates, irregular plates, non-planar dielectric bodies, dielectric structures with internal voids, or the like). Furthermore, the cross-sectional shape of the applicators may be chosen so that the array of applicators may be packed together as tightly as possible (i.e., a closed-packed array). Embodiments may also allow for applicators in the array of microwave modules to have non-uniform sizes. As such, the packing efficiency may be improved further.

The use of an array of microwave modules also provides greater flexibility in the ability to locally change the plasma density by independently changing the power settings of each microwave module. This allows for uniformity optimization during plasma processing, such as adjustments made for wafer edge effects, adjustments made for incoming wafer nonuniformity, and the ability to adjust the plasma density for processing systems in which a nonuniformity is needed to compensate for the design of the processing system (e.g., to accommodate the nonuniform radial velocity of the rotating wafers in some processing chambers).

Additional embodiments may also include one or more plasma monitoring sensors. Such embodiments provide a way to measure the density of the plasma (or any other plasma property) locally by each applicator, and to use that measurement as part of a feedback loop to control the power applied to each microwave module. Accordingly, each microwave module may have independent feedback, or a subset of the microwave modules in the array may be grouped in zones of control where the feedback loop controls the subset of microwave modules in the zone.

In addition to the enhanced tuneability of the plasma, the use of individual microwave modules provides a greater power density than currently available plasma sources. For example, microwave modules may allow for a power density that is approximately five or more times greater than typical RF plasma processing systems. For example, typical power into a plasma enhanced chemical vapor deposition process is approximately 3,000 W, and provides a power density of approximately 4 W/cm$^2$ for a 300 mm diameter wafer. In contrast, microwave modules according to embodiments may use a 300 W power amplifier with a 4 cm diameter applicator, to provide a power density of approximately 24 W/cm$^2$.

Referring now to FIG. 1, a cross-sectional illustration of a processing tool 100 is shown, according to an embodiment. The processing tool 100 may be a processing tool suitable for any type of processing operation that utilizes a plasma. For example, the plasma processing tool 100 may be a processing tool used for plasma enhanced chemical vapor deposition (PECVD), plasma enhanced atomic layer deposition (PEALD), etch and selective removal, and plasma cleaning. While the embodiments described in detail herein are directed to plasma processing tools, it is to be appreciated that additional embodiments may include a processing tool 100 that include any tool that utilizes microwave radiation. For example, a processing tool 100 that utilizes microwave radiation without needing the formation of a plasma may include industrial heating and/or curing processing tools 100.

Generally, embodiments include a processing tool 100 that includes a chamber 178. In processing tools 178 that are used for plasma processing, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that the processing tool may include a showerhead for evenly distributing the processing gases over a substrate 174.

In an embodiment, the substrate 174 may be supported on a chuck 176. For example, the chuck 176 may be any suitable chuck, such as an electrostatic chuck. The chuck may also include cooling lines and/or a heater to provide temperature control to the substrate 174 during processing. Due to the modular configuration of the microwave modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes one or more modular microwave sources 105. The modular microwave source 105 may include solid state microwave amplification circuitry 130 and an applicator 142. In an embodiment, a voltage control circuit 110 provides an input voltage to a voltage controlled oscillator 120 in order to produce microwave radiation at a desired frequency that is transmitted to the solid state microwave amplification circuitry 130 in each modular microwave source 105. After processing by the microwave amplification circuitry 130, the microwave radiation is transmitted to the applicator 142. According to an embodiment, an array 140 of applicators 142 are coupled to the chamber 178 and each function as an antenna for coupling the microwave radiation to the processing gasses in the chamber 178 to produce a plasma.

Figure 2:
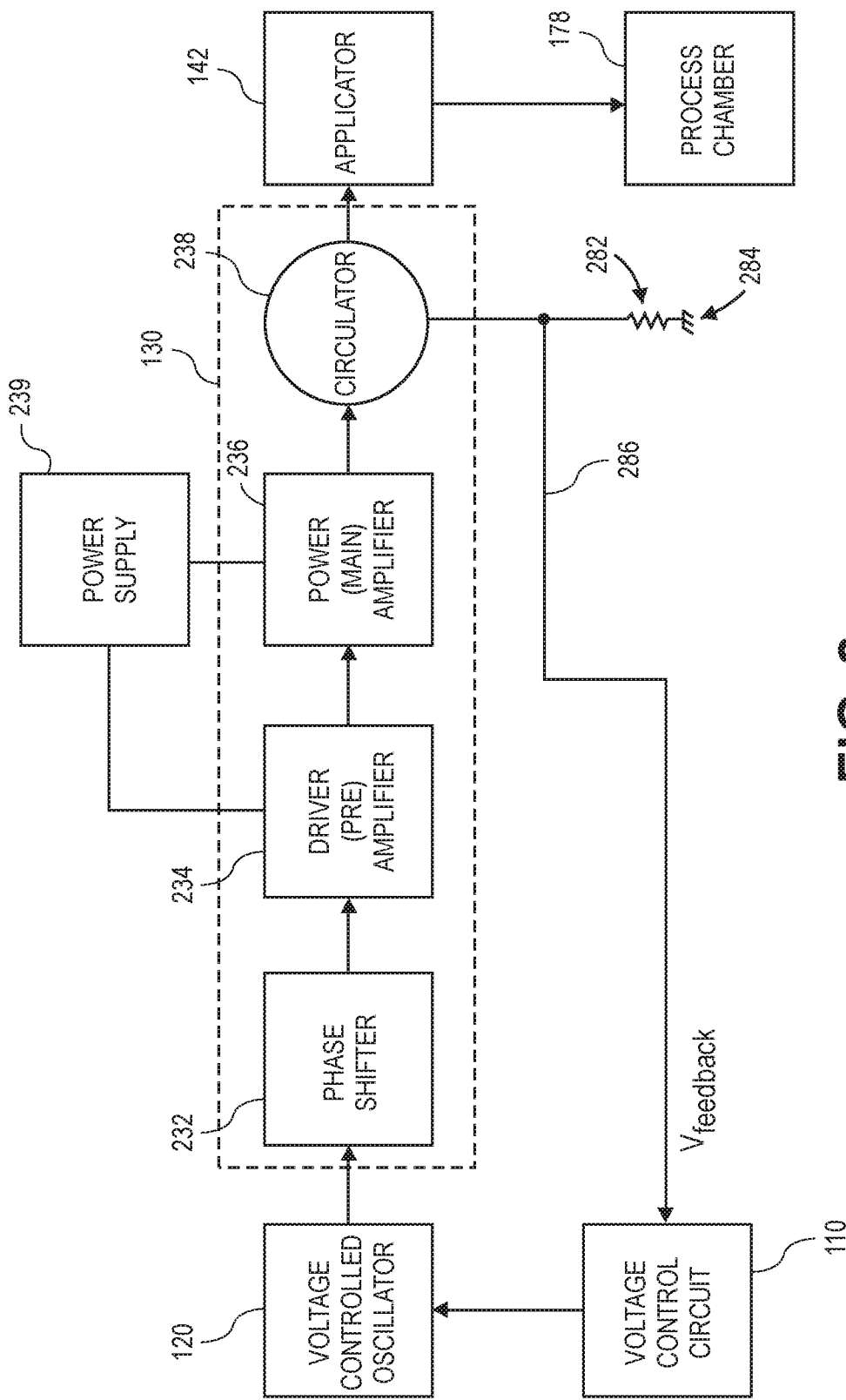
FIG. 2 is a schematic block diagram of a solid state microwave plasma source, in accordance with an embodiment.

Referring now to FIG. 2, a schematic block diagram of the electronics in a modular microwave source is shown and described in greater detail, according to an embodiment. As described above, a voltage control circuit 110 provides an input voltage to a voltage controlled oscillator 120. Embodiments may include an input voltage between approximately 1V and 10V DC. The voltage controlled oscillator 120 is an electronic oscillator whose oscillation frequency is controlled by the input voltage. According to an embodiment, the input voltage from the voltage control circuit 110 results in the voltage controlled oscillator 120 oscillating at a desired frequency. In an embodiment, the microwave radiation may have a frequency between approximately 2.3 GHz and 2.6 GHz.

According to an embodiment, the microwave radiation is transmitted from the voltage controlled oscillator 120 to the microwave amplification circuitry 130. In the illustrated embodiment, a single instance of the microwave amplification circuitry 130 is shown. However, embodiments may include any number of instances of microwave amplification circuitry 130. Particularly, the number of instances of microwave amplification circuitry 130 may be equal to the number of applicators 142 needed in the array 140 of applicators 142. As such, each applicator 142 may be coupled to different instances of the microwave amplification circuitry 130 to provide individual control of the power supplied to each applicator 142. According to an embodiment, when more than one modular microwave source 105 is used in the process tool 100, the microwave amplification circuitry 130 may include a phase shifter 232. When only a single applicator is used, the phase shifter 232 may be omitted. The microwave amplification circuitry 130 may also include a driver/pre-amplifier 234, and a main microwave power amplifier 236 that are each coupled to a power supply 239. According to an embodiment, the microwave amplification circuitry 130 may operate in a pulse mode. For example, the microwave amplification circuitry 130 may have a duty cycle between 1% and 99%. In a more particular embodiment, the microwave amplification circuitry 130 may have a duty cycle between approximately 15% and 30%.

In an embodiment, the microwave radiation may be transmitted to the applicator 142 after being amplified. However, part of the power transmitted to the applicator 142 may be reflected back due to the mismatch in the output impedance. Accordingly, some embodiments also include a feedback line 286 that allows for the level of reflected power to be fed back to the voltage control circuit 110. The level of reflected power $V_{feedback}$ may be directed to the feedback line 286 by using a circulator 238 between the power amplifier 236 and the applicator 142. The circulator 238 directs the reflected power to a dummy load 282 and ground 284, with the level of reflected power $V_{feedback}$ being read prior to the dummy load 282. In an embodiment, the level of reflected power $V_{feedback}$ may be used by the voltage control circuit 110 to adjust the output voltage that is sent to the voltage controlled oscillator 120, which in turn varies the output frequency of the microwave radiation that is transmitted to the microwave amplification circuitry 130. The presence of such a feedback loop allows for embodiments to provide continuous control of the input voltage of the voltage controlled oscillator 120, and allows for reductions in the level of reflected power $V_{feedback}$. In an embodiment, the feedback control of the voltage controlled oscillator 120 may allow for the level of the reflected power to be less than approximately 5% of the forward power. In some embodiments, the feedback control of the voltage controlled oscillator 120 may allow for the level of the reflected power to be less than approximately 2% of the forward power. Accordingly, embodiments allow for an increased percentage of the forward power to be coupled into the processing chamber 178, and increases the available power density coupled to the plasma. Furthermore, impedance tuning using a feedback line 286 is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 120.

Figure 3A:
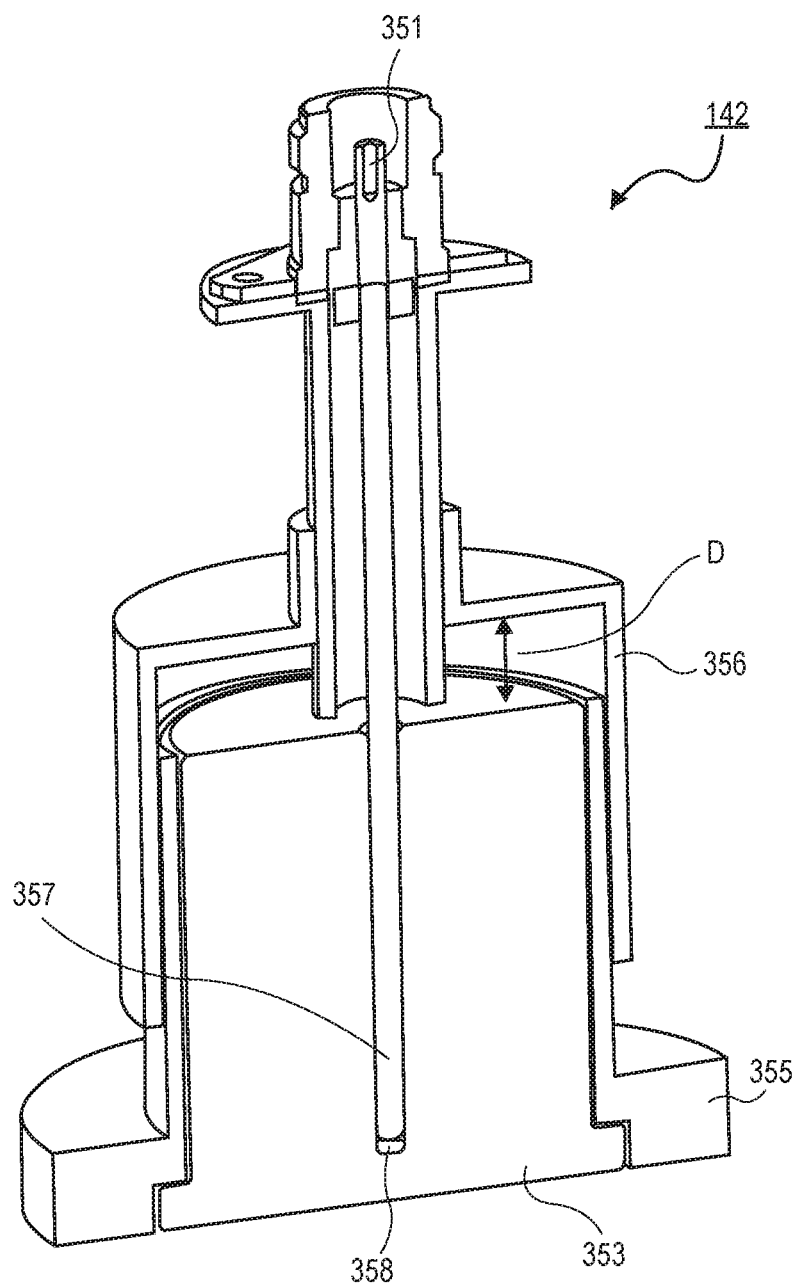
FIG. 3A is cross-sectional illustration of an applicator that may be used to couple microwave radiation to a processing chamber, in accordance with an embodiment.

Referring now to FIG. 3A, a cut-away illustration of an applicator 142 is shown, according to an embodiment. In an embodiment, the microwave radiation is transmitted to an applicator 142 by a coaxial cable 351 that couples to a monopole 357 that extends axially through the applicator 142. The monopole 357 may also extend into a channel 358 formed into a center of a dielectric resonant cavity 353. The dielectric resonant cavity 353 may be a dielectric material, such as quartz, aluminum oxide, titanium oxide, or the like. Additional embodiments may also include a resonant cavity 353 that does not include a material (i.e., the dielectric resonant cavity 353 may be air or a vacuum). According to an embodiment, the dielectric resonator is dimensioned so that the dielectric resonator supports resonance of the microwave radiation. Generally, the size of the dielectric resonant cavity 353 is dependent on the dielectric constant of the material used to form the dielectric resonant cavity 353 and the frequency of the microwave radiation. For example, materials with higher dielectric constants would allow for smaller resonant cavities 353 to be formed. In an embodiment where the dielectric resonant cavity 353 includes a circular cross-section, the diameter of the dielectric resonant cavity 353 may be between approximately 1 cm and 15 cm. In an embodiment, the cross-section of the dielectric resonant cavity 353 along a plane perpendicular to the monopole 357 may be any shape, so long as the dielectric resonant cavity 353 is dimensioned to support resonance. In the illustrated embodiment, the cross-section along a plane perpendicular to the monopole 357 is circular, though other shapes may also be used, such as polygons (e.g., triangles, rectangles, etc.), symmetrical polygons (e.g., squares, pentagons, hexagons, etc.), ellipses, or the like).

In an embodiment, the cross-section of the dielectric resonant cavity 353 may not be the same at all planes perpendicular to the monopole 357. For example, the cross-section of a bottom extension proximate to the open end of the applicator housing 355 is wider than the cross-section of the dielectric resonant cavity proximate to the channel 358. In addition to having cross-sections of different dimensions, the dielectric resonant cavity 353 may have cross-sections with different shapes. For example, the portion of the dielectric resonant cavity 353 proximate to the channel 358 may have a circular shaped cross-section, whereas the portion of the dielectric resonant cavity 353 proximate to the open end of the applicator housing 355 may be a symmetrical polygon shape (e.g., pentagon, hexagon, etc.). However, it is to be appreciated that embodiments may also include a dielectric resonant cavity 353 that has a uniform cross-section at all planes perpendicular to the monopole 357.

According to an embodiment, the applicator 353 may also include an impedance tuning backshort 356. The backshort 356 may be a displaceable enclosure that slides over an outer surface of the applicator housing 355. When adjustments to the impedance need to be made, an actuator (not shown) may slide the backshort 356 along the outer surface of the applicator housing 355 to change a distance D between a surface of the backshort 356 and a top surface of the dielectric resonant cavity 353. As such, embodiments provide more than one way to adjust the impedance in the system. According to an embodiment, an impedance tuning backshort 356 may be used in conjunction with the feedback process described above to account for impedance mismatches. Alternatively, the feedback process or an impedance tuning backshort 356 may be used by themselves to adjust for impedance mismatches.

According to an embodiment, the applicator 142 functions as a dielectric antenna that directly couples the microwave electromagnetic field into the processing chamber 178. The particular axial arrangement of the monopole 357 entering the dielectric resonant cavity 353 may produce an TM01δ mode excitation. However different modes of excitation may be possible with different applicator arrangements. For example, while an axial arrangement is illustrated in FIG. 3, it is to be appreciated that the monopole 357 may enter the dielectric resonant cavity 353 from other orientations. In one such embodiment, the monopole 357 may enter the dielectric resonant cavity 353 laterally, (i.e., through a sidewall of the dielectric resonant cavity 353).

Figure 3B:
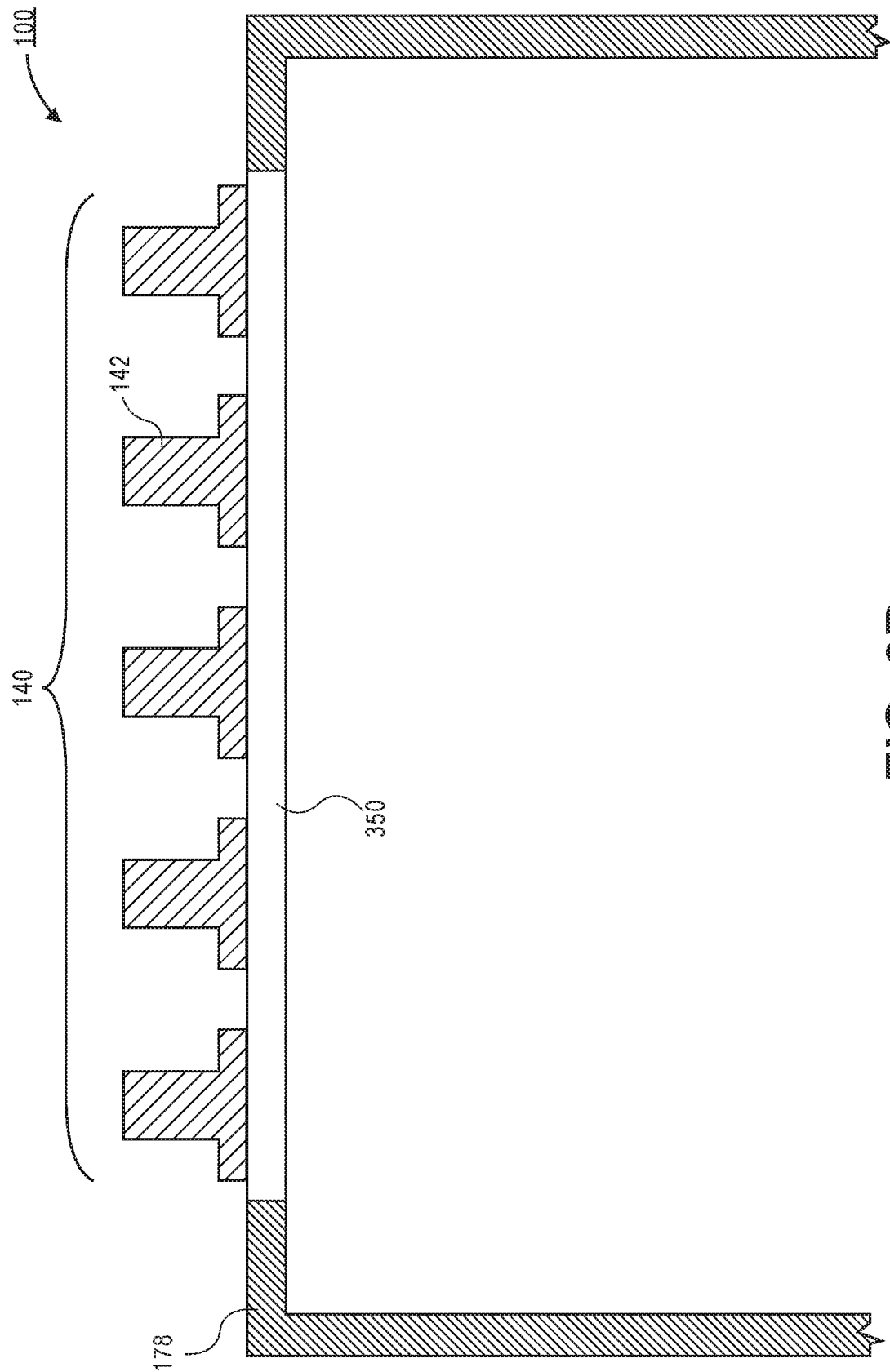
FIG. 3B is a cross-sectional illustration of an array of applicators positioned on a dielectric sheet that is part of the processing chamber, in accordance with an embodiment.

Referring now to FIG. 3B, an illustration of a portion of a processing tool 100 with an array 140 of applicators 142 coupled to the chamber 178 is shown, according to an embodiment. In the illustrated embodiment, the microwave radiation from the applicators 142 is coupled into the chamber 178 by being positioned proximate to a dielectric plate 350. The proximity of the applicators 142 to the dielectric plate 350 allows for the microwave radiation resonating in the dielectric resonant cavity 353 (not shown in FIG. 3B) to couple with the dielectric plate 350, which may then couple with processing gasses in the chamber to generate a plasma. In one embodiment, the dielectric resonant cavity 353 may be in direct contact with the dielectric plate 350. In an additional embodiment, the dielectric resonant cavity 353 may be spaced away from a surface of the dielectric plate 350, so long as the microwave radiation can still be transferred to the dielectric plate 350.

According to an embodiment, the array 140 of applicators 142 may be removable from the dielectric plate 350 (e.g., for maintenance, to rearrange the array of applicators to accommodate a substrate with different dimensions, or for any other reason) without needing to remove the dielectric plate 350 from the chamber 178. Accordingly, the applicators 142 may be removed from the processing tool 100 without needing to release a vacuum in the chamber 178. According to an additional embodiment, the dielectric plate 350 may also function as a gas injection plate or a showerhead.

Figure 4A:
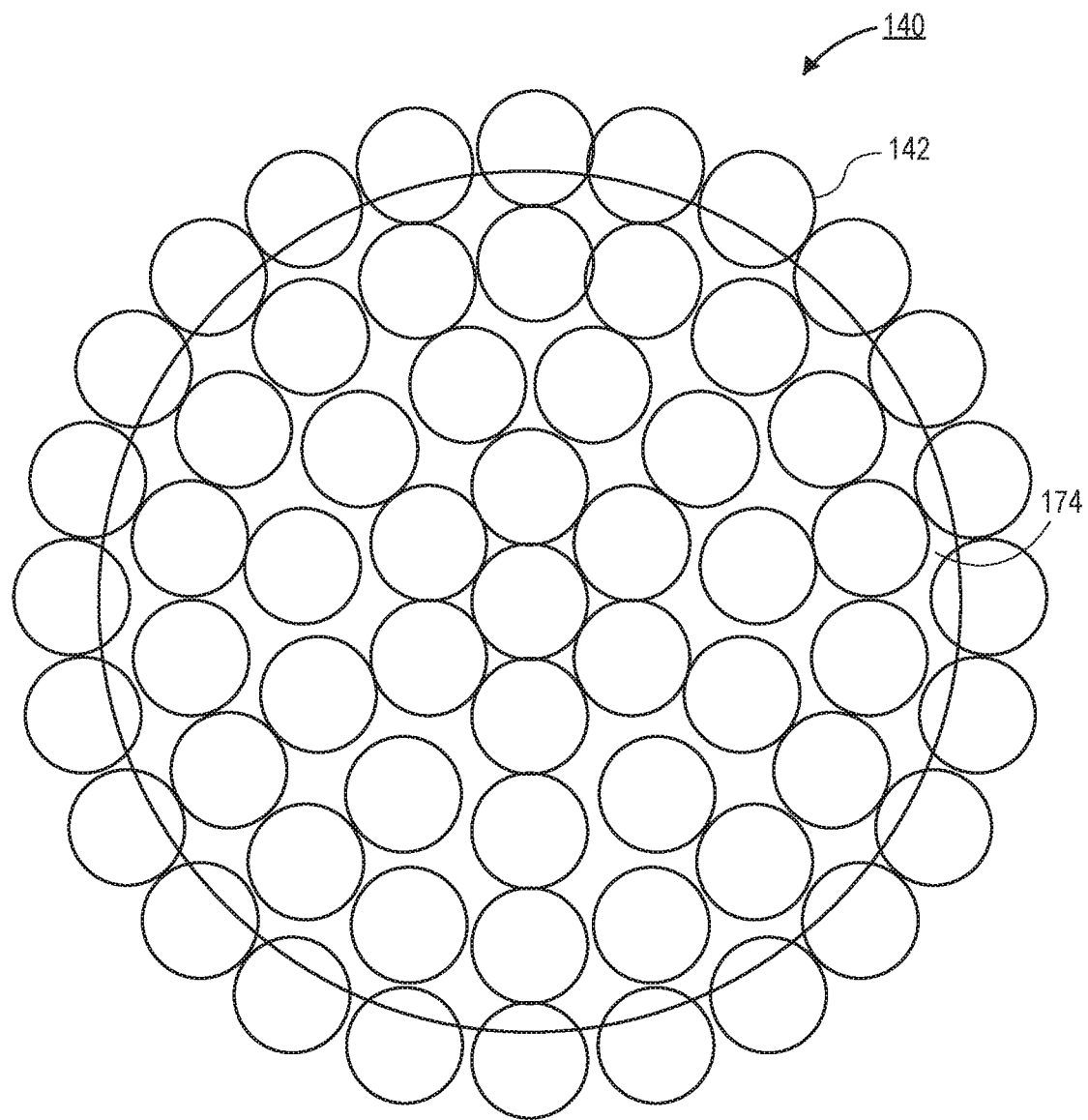
FIG. 4A is a plan view of an array of applicators that may be used to couple microwave radiation to a processing chamber, in accordance with an embodiment.

As noted above, an array of applicators 140 may be arranged so that they provide coverage of an arbitrarily shaped substrate 174. FIG. 4A is a plan view illustration of an array 140 of applicators 142 that are arranged in a pattern that matches a circular substrate 174. By forming a plurality of applicators 142 in a pattern that roughly matches the shape of the substrate 174, the plasma becomes tunable over the entire surface of the substrate 174. For example, each of the applicators 142 may be controlled so that a plasma with a uniform plasma density across the entire surface of the substrate 174 is formed. Alternatively, one or more of the applicators 142 may be independently controlled to provide plasma densities that are variable across the surface of the substrate 174. As such, incoming nonuniformity present on the substrate may be corrected. For example, the applicators 142 proximate to an outer perimeter of the substrate 174 may be controlled to have a different power density than applicators proximate to the center of the substrate 174.

In FIG. 4A, the applicators 142 in the array 140 are packed together in a series of concentric rings that extend out from the center of the substrate 174. However, embodiments are not limited to such configurations, and any suitable spacing and/or pattern may be used depending on the needs of the processing tool 100. Furthermore, embodiments allow for applicators 142 with any symmetrical cross-section, as described above. Accordingly, the cross-sectional shape chosen for the applicator may be chosen to provide enhanced packing efficiency.

Figure 4B:
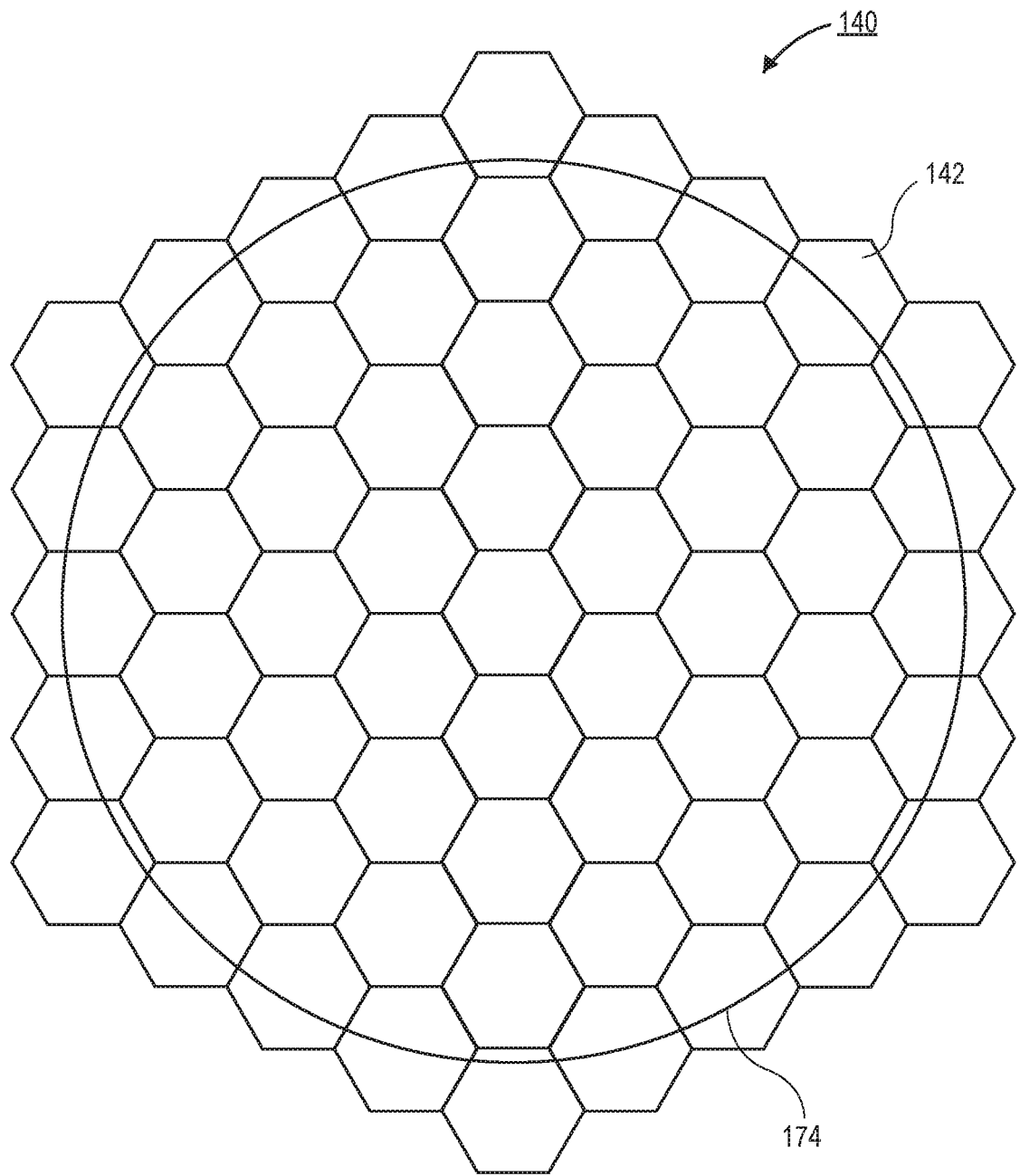
FIG. 4B is a plan view of an array of applicators that may be used to couple microwave radiation to a processing chamber, in accordance with an additional embodiment.

Referring now to FIG. 4B, a plan view of an array 140 of applicators 142 with a non-circular cross-section is shown, according to an embodiment. The illustrated embodiment includes applicators 142 that have hexagonal cross-sections. The use of such an applicator may allow for improved packing efficiency because the perimeter of each applicator 142 may mate nearly perfectly with neighboring applicators 142. Accordingly, the uniformity of the plasma may be enhanced even further since the spacing between each of the applicators 142 may be minimized. While FIG. 4B illustrates neighboring applicators 142 sharing sidewall surfaces, it is to be appreciated that embodiments may also include non-circular symmetrically shaped applicators that include spacing between neighboring applicators 142.

Figure 4C:
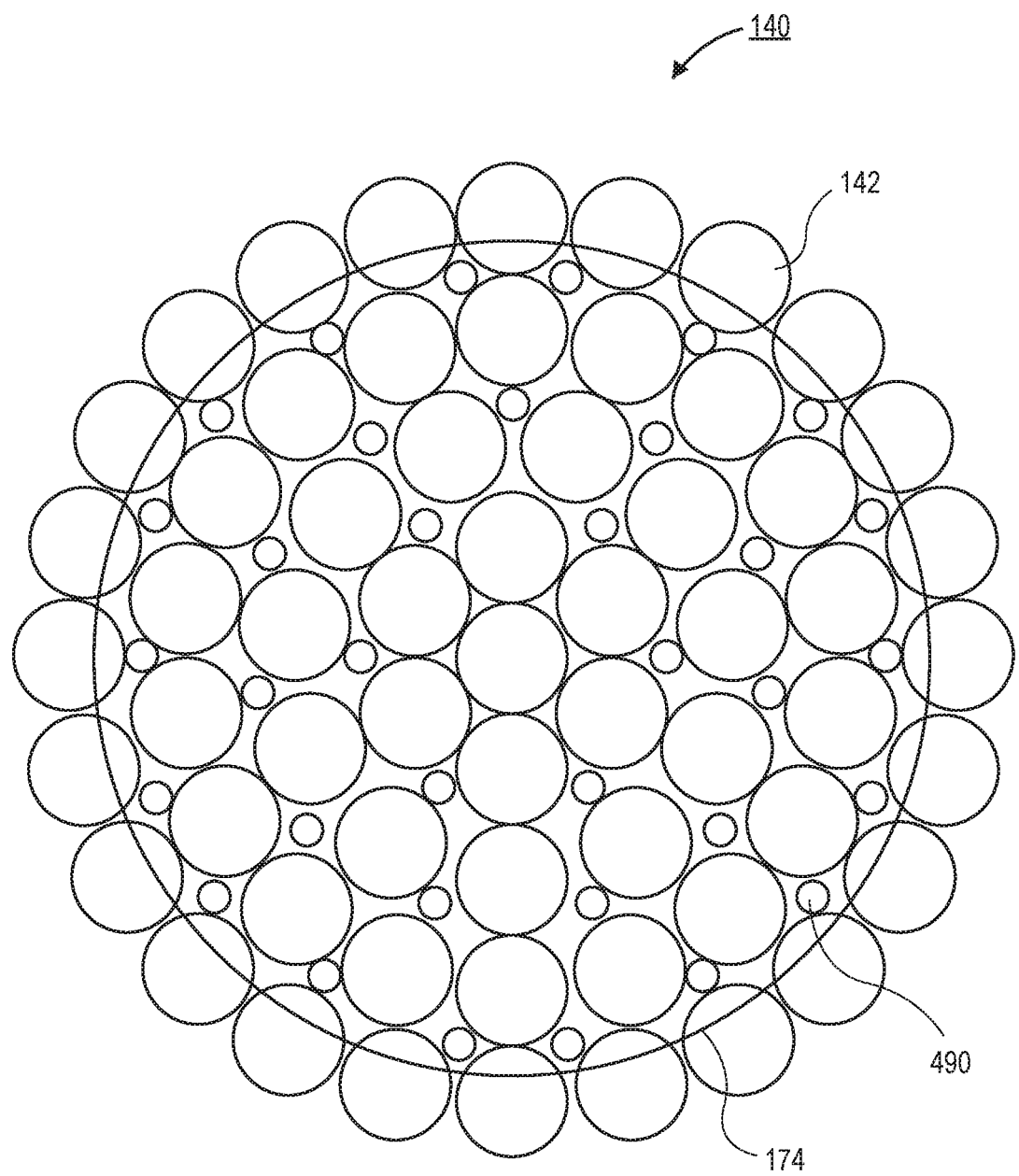
FIG. 4C is a plan view of an array of applicators and a plurality of sensors for detecting conditions of a plasma, in accordance with an embodiment.

Referring now to FIG. 4C, an additional plan-view illustration of an array 140 of applicators 142 is shown according to an embodiment. The array 140 in FIG. 4C is substantially similar to the array 140 described above with respect to FIG. 4A, except that a plurality of sensors 490 are also included. The plurality of sensors provides improved process monitoring capabilities that may be used to provide additional feedback control of each of the modular microwave sources 105. In an embodiment, the sensors 490 may include one or more different sensor types 490, such as plasma density sensors, plasma emission sensors, or the like. Positioning the sensors across the surface of the substrate 174 allows for the plasma properties at given locations of the processing chamber 100 to be monitored.

According to an embodiment, every applicator 142 may be paired with a different sensor 490. In such embodiments, the output from each sensor 490 may be used to provide feedback control for the respective applicator 142 to which the sensor 490 has been paired. Additional embodiments may include pairing each sensor 490 with a plurality of applicators 142. For example, each sensor 490 may provide feedback control for multiple applicators 142 to which the sensor 490 is proximately located. In yet another embodiment, feedback from the plurality of sensors 490 may be used as a part of a multi-input multi-output (MIMO) control system. In such an embodiment, each applicator 142 may be adjusted based on feedback from multiple sensors 490. For example, a first sensor 490 that is a direct neighbor to a first applicator 142 may be weighted to provide a control effort to the first applicator 142 that is greater than the control effort exerted on the first applicator 142 by a second sensor 490 that is located further from the first applicator 142 than the first sensor 490.

Figure 4D:
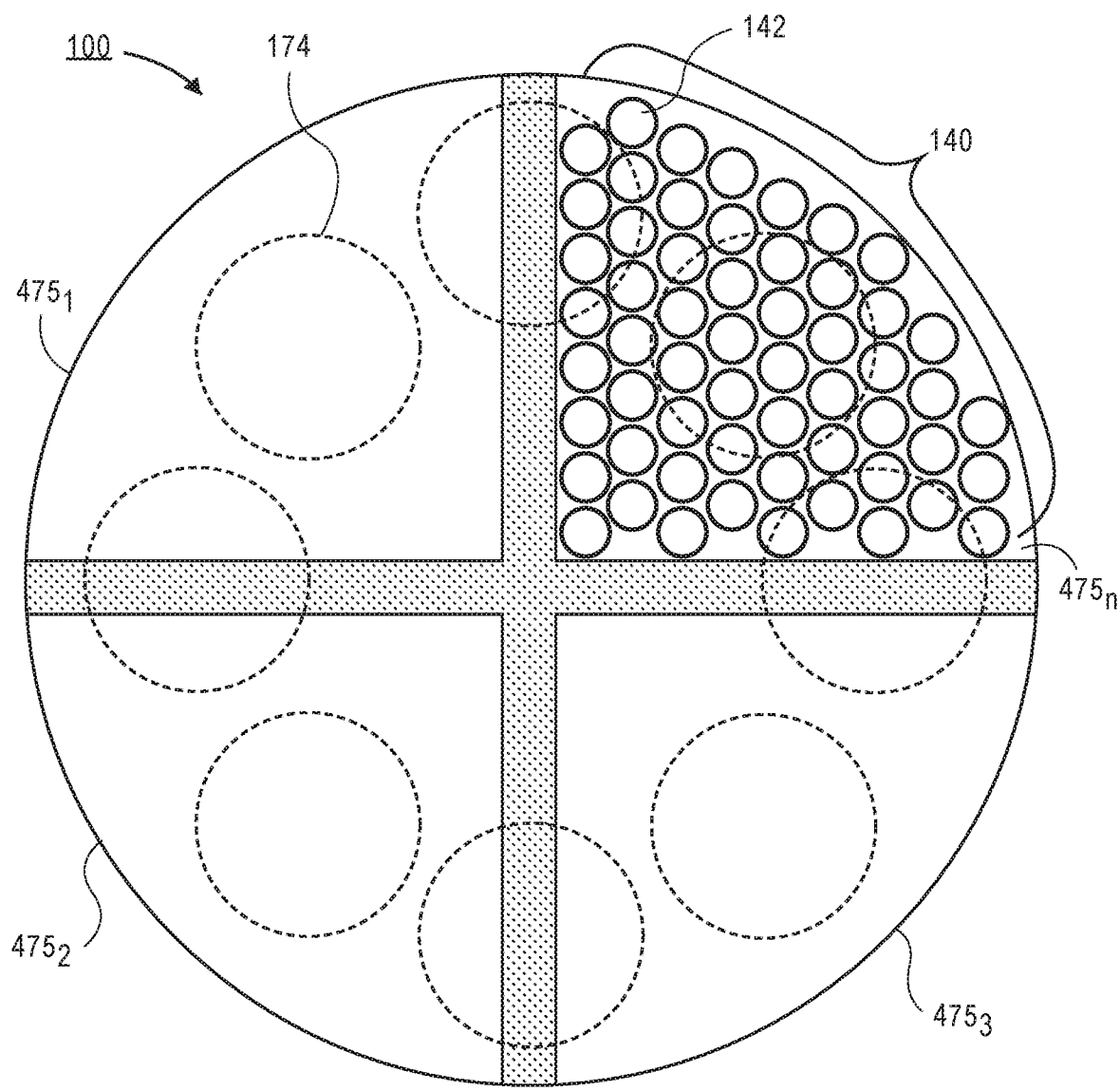
FIG. 4D is a plan view of an array of applicators that are formed in one zone of a multi-zone processing tool, in accordance with an embodiment.

Referring now to FIG. 4D, an additional plan-view illustration of an array 140 of applicators 142 positioned in a multi-zone processing tool 100 is shown, according to an embodiment. In an embodiment, the multi-zone processing tool 100 may include any number of zones. For example, the illustrated embodiment includes zones 475$_1$-475$_n$. Each zone 475 may be configured to perform different processing operations on substrates 174 that are rotated through the different zones 475. As illustrated, a single array 140 is positioned in zone 475$_n$. However, embodiments may include multi-zone processing tools 100 with an array 140 of applicators 142 in one or more of the different zones 475, depending on the needs of the device. The spatially tunable density of the plasma provided by embodiments allows for the accommodation of nonuniform radial velocity of the rotating substrates 174 as they pass through the different zones 475.

Referring now to FIGS. 5A-5E, different embodiments are shown that illustrate the flexible nature of how the array of applicators 140 may be arranged in order provide various shapes of plasma. As will be described in greater detail below, embodiments allow for the applicators 142 of the microwave modules to be arranged on (or partially embedded within) dielectric bodies that are any desired shape, (e.g., symmetric plates, irregular plates, non-planar dielectric bodies, dielectric structures with internal voids, or the like). Accordingly, embodiments allow for plasmas to be generated that can be any desired shape and are not limited to the constraining dimensions of waveguides, such as those used in currently available processing tools described above.

Figure 5A:
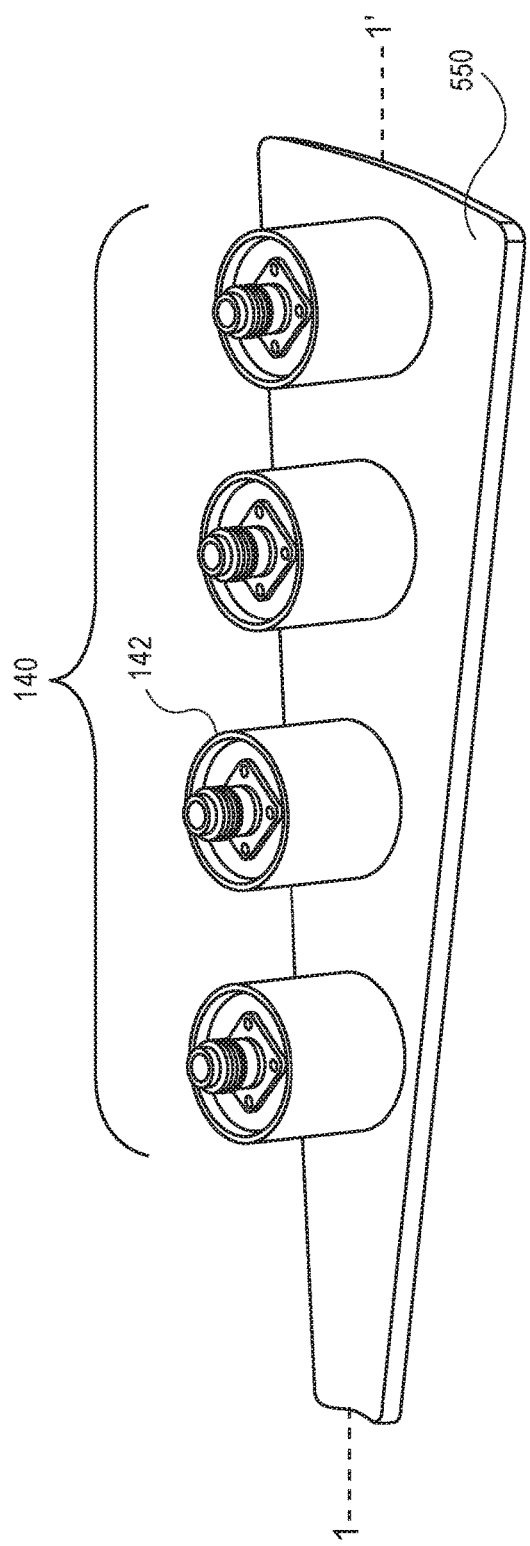
FIG. 5A is a perspective view of an array of applicators mounted over a symmetric dielectric plate, according to an embodiment.

Referring now to FIG. 5A, a perspective view of an array 140 of applicators 142 positioned over a symmetric dielectric plate 550 is shown, according to an embodiment. In the illustrated embodiment, the dielectric plate 550 is substantially wedge shaped and is symmetric about line 1-1'. According to an embodiment, the dielectric plate 550 may function substantially the same as dielectric plate 350 described above with respect to FIG. 3B. As such, the microwave radiation resonating in the dielectric resonant cavity (not shown in FIG. 5A) couples with the dielectric plate 550, which may then couple with processing gasses in the chamber to generate a plasma. The dielectric plate 550 serves to spread the microwave radiation, and generally allows for the shape of the resulting plasma to substantially match the shape of the dielectric plate 550, even though the microwave radiation originates from a plurality of discrete applicators 142.

However, it is to be appreciated that the shape of the resulting plasmas is not limited by the shape of the dielectric plate 550 because each of the applicators 142 in the array 140 may be individually controllable or controlled in groups. As such, embodiments may allow for the constructive and destructive interference of adjacent sources locally and independently to achieve a desired plasma shape and/or to increase uniformity of the plasma. For example, the microwave sources for neighboring applicators 142 may be phase locked to each other with a certain phase differences to produce a desired plasma shape. In a particular embodiment, two adjacent applicators 142 may have their microwave sources phase locked to 180 degree out of phase. This will result in a destructive interference of the two microwave sources between the applicators resulting in a weaker plasma density in that location. Similarly, constructive interference may be used to produce a stronger plasma density in a desired location.

Additionally, controlling frequency, amplitude, phase angle, and duty cycle during a time period for each of the applicators 142 (or groups of applicators 142) may be used to improve uniformity of the on-wafer result. The individualized control of any or all of these parameters for each of the applicators 142 allows for "hot spots" due to interactions of the applicators 142 to be minimized or avoided completely. In an embodiment, varying the frequency and amplitude of the power sources to the individual applicators 142 results in improved uniformity because the hot spots are reduced and/or time-averaged. In an embodiment, the timing of the pulsed power to each module is varied to minimize interactions, for example by having nearest neighbors where the timing of the pulsed power is such that no neighboring applicators 142 are both on at the same time.

In an embodiment, the thickness of the dielectric plate 550 is minimized in order to place the applicators 142 as close to the processing environment as possible. For example, the thickness of the dielectric plate 550 may be less than approximately 30 mm. In some embodiments, the thickness of the dielectric plate 550 may be between 5 mm and 15 mm thick. However, it is to be appreciated that decreasing the thickness of the dielectric plate 550 may reduce the structural integrity of the dielectric plate 550. Depending on the conditions in the processing chamber, reducing the thickness of the dielectric plate 550 may result in the pressure external to the processing chamber cracking or otherwise damaging the dielectric plate 550.

Figure 5B:
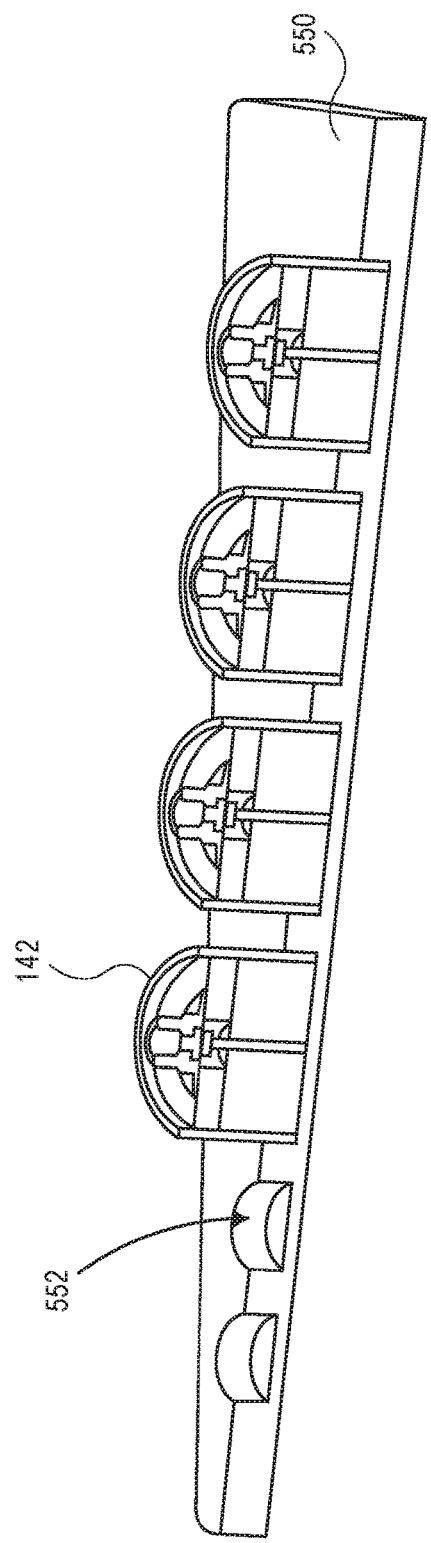
FIG. 5B is a perspective view cut-away of an array of applicators that are partially embedded within a symmetric dielectric plate, according to an embodiment.

Accordingly, embodiments may also include a dielectric plate that includes recesses in which the applicators may be placed. A dielectric plate according to such an embodiment is illustrated in FIG. 5B. In the illustrated embodiment, six recesses 552 are formed into the dielectric plate 550. However, it is to be appreciated that an number of recesses 552 may be included. For illustrative purposes, two of the recesses 552 are empty (i.e., there is no applicator 142 placed in the recess 552) in order to show an exemplary illustration of how a recess 552 may look without an applicator 142. Additionally, it is to be appreciated that in some embodiments the applicators 142 may be seated into the recess 552, but not permanently affixed to the dielectric plate 550. Accordingly, the applicators 142 may be removed as needed.

The recesses 552 allow for the applicators 142 to be separated from the processing area of the chamber by a thinner portion of the dielectric material. Accordingly, the transfer of the microwave radiation into the processing chamber may be more efficient without significantly reducing the structural integrity of the dielectric plate 550. For example, in embodiments with a recesses 552, the applicators 142 may be separated from the processing area of the chamber by a dielectric material with a thickness less than 15 mm. In some embodiments, the thickness of the dielectric material at the bottom of the recess 552 may be approximately 5 mm or less.

In addition to illustrating the recesses 552, FIG. 5B also illustrates that embodiments may also include applicators 142 that are not all the same size. For example, the recesses 552 that are empty (i.e., the two leftmost recesses 552) are smaller than the other recesses 552. As such, the applicators 142 that are designed to fit into these recesses may have a smaller diameter cross-section than the other applicators 142. The size of the applicators 142 may be varied without changing the resonance by changing the dielectric material in the applicator 142. For example the dielectric constant of the resonator in each applicator 142 may be chosen so that each applicator 142 has the same resonance. The ability to modify the size of the applicators 142 allows for increased packing efficiency over the dielectric plate 550. For example, in the wedge shaped dielectric plate 550 illustrated in FIG. 5B, the smaller applicators 142 may be positioned along the narrower portion of the wedge in order to ensure applicators 142 are positioned over a greater portion of the surface area of the dielectric plate 550.

Figure 5C:
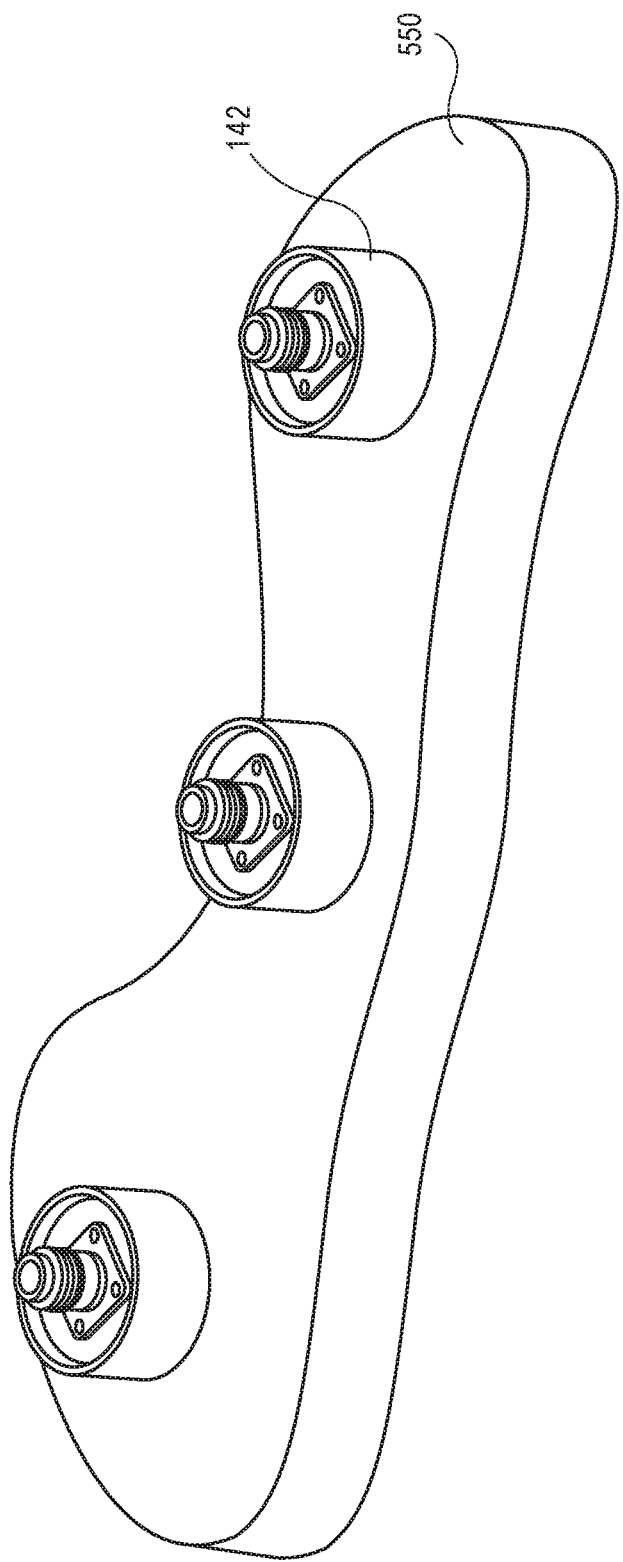
FIG. 5C is a perspective view of an array of applicators mounted over an irregular shaped dielectric plate, according to an embodiment.

As noted above, the modular design and tunability of the array 140 of applicators 142 allows for the formation of a plasma of any desired shape. A generic example of such an embodiment is illustrated in the perspective view shown in FIG. 5C. As illustrated, the dielectric plate 550 in FIG. 5C is an arbitrary shape and a plurality of applicators 142 are placed over the surface of the dielectric plate 550. In other embodiments, the dielectric plate 550 may be any shape, (e.g., polygon, circular, elliptical, the shape may include straight edges and curved edges, or the like). In such embodiments, the applicators 142 may be distributed over the surface in order to provide the desired shape of the plasma. For example, the applicators 142 may each be a uniform shape, the applicators 142 may include multiple different shapes, there may be applicators 142 with different geometries, or the any other configuration needed to provide the desired shape of the plasma. Furthermore, while the applicators 142 illustrated in FIG. 5C are shown sitting on a top surface of the dielectric plate 550, it is to be appreciated that the applicators 142 may also be placed in recesses formed in the dielectric plate 550, similar to FIG. 5B described above.

Figure 5D:
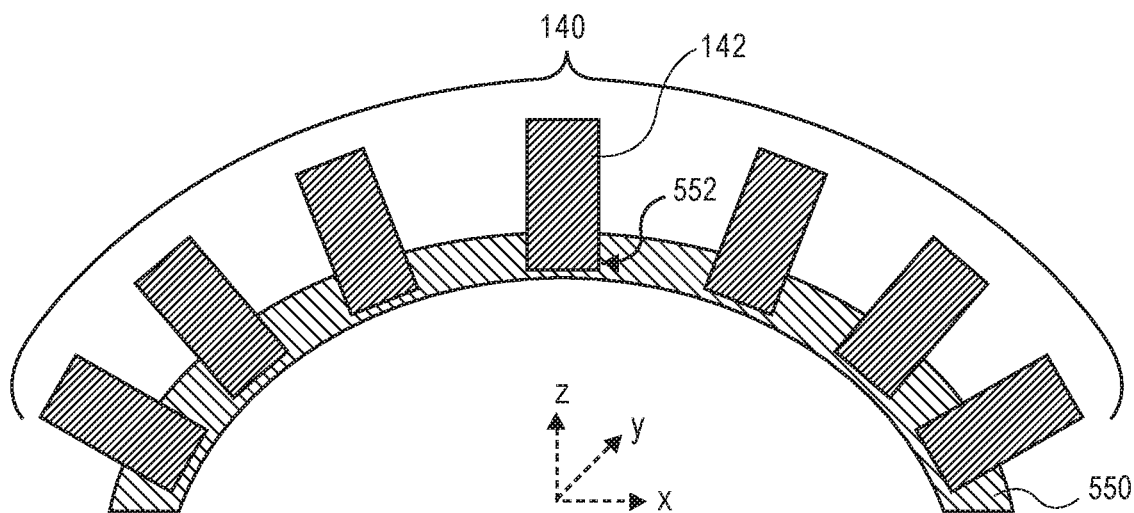
FIG. 5D is a cross-sectional illustration of an array of applicators partially embedded within a non-planar dielectric body, according to an embodiment.
Figure 5E:
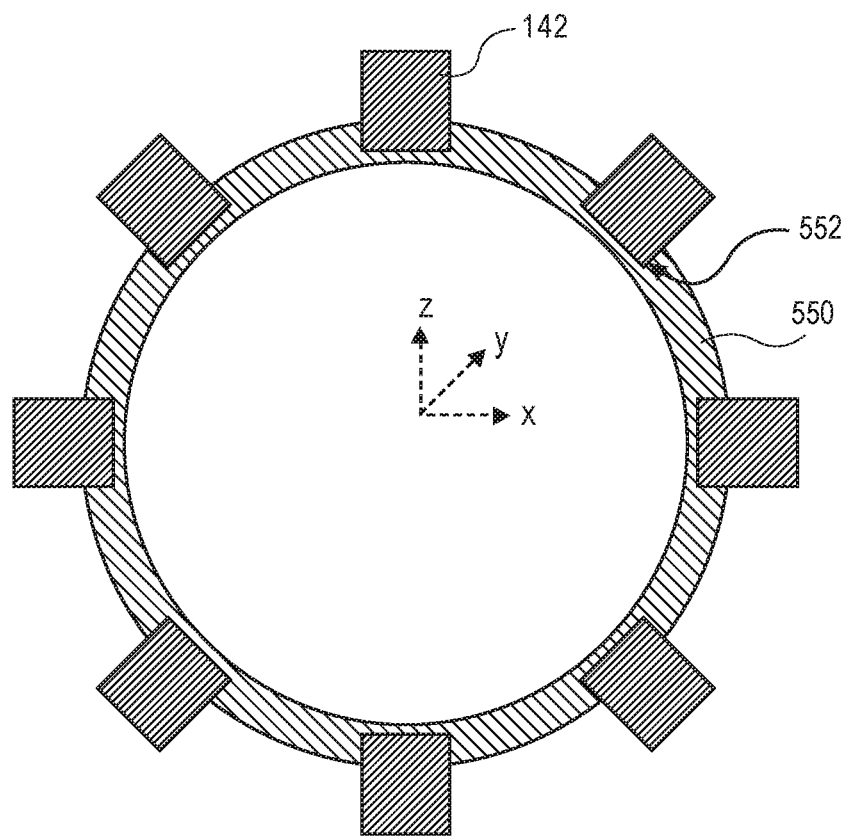
FIG. 5E is a cross-sectional illustration of an array of applicators partially embedded within a spherical dielectric body, according to an embodiment.

In yet another embodiment, the array of applicators may be arranged in a non-planar configuration. Such an embodiment is illustrated in the cross-sectional illustration shown in FIG. 5D. As shown in FIG. 5D, an array 140 of applicators 142 are set into recess 552 formed into a non-planar dielectric body 550. In the illustrated embodiment, the non-planar dielectric body 550 is shown in the X-Z plane. In an embodiment, the non-planar dielectric body 550 may be any shape that allows for the applicators 142 to be positioned at a non-uniform Z-height. For example, the non-planar dielectric body 550 may be arch shaped, dome shaped, pyramid shaped, sphere shaped, or any other desired shaped. Accordingly, embodiments allow for the formation of a substantially non-planar plasma within a processing chamber. Such an embodiment may be beneficial when a plasma process is needed to process objects that are not necessarily planar (e.g., objects other than substrates, such as wafers, plates, or the like), or collections of objects that are arrayed in a non-planar group.

According to another embodiment, a non-planar dielectric body 550 may have a cross-section which is circular. Such an embodiment is shown in the cross-sectional illustration shown in FIG. 5E. As shown, the non-planar dielectric body 550 forms a ring in the X-Z plane. In some embodiments, the non-planar dielectric body 550 may extend in the Y plane to form a cylinder. In a further embodiment, a non-planar dielectric body may have cross-section which is triangular. In a further embodiment, a non-planar dielectric body may have cross-section which is square. In a further embodiment, a non-planar dielectric body may have cross-section which is rectangular. In a further embodiment, a non-planar dielectric body may have cross-section for which the boundary is a Jordan curve (i.e. a non-self-intersecting continuous loop in a plane). In additional embodiments the non-planar dielectric body 550 may form a sphere (i.e., the non-planar dielectric body may be a dielectric body with an internal void). In embodiments where the non-planar dielectric body 550 is a three-dimensional shape with an internal void, the non-planar body 550 may be comprised of two or more dielectric bodies that are coupled together to form the shape. Such embodiments may be beneficial when a plasma process is needed to process all surfaces of a three-dimensional object.

Figure 6:
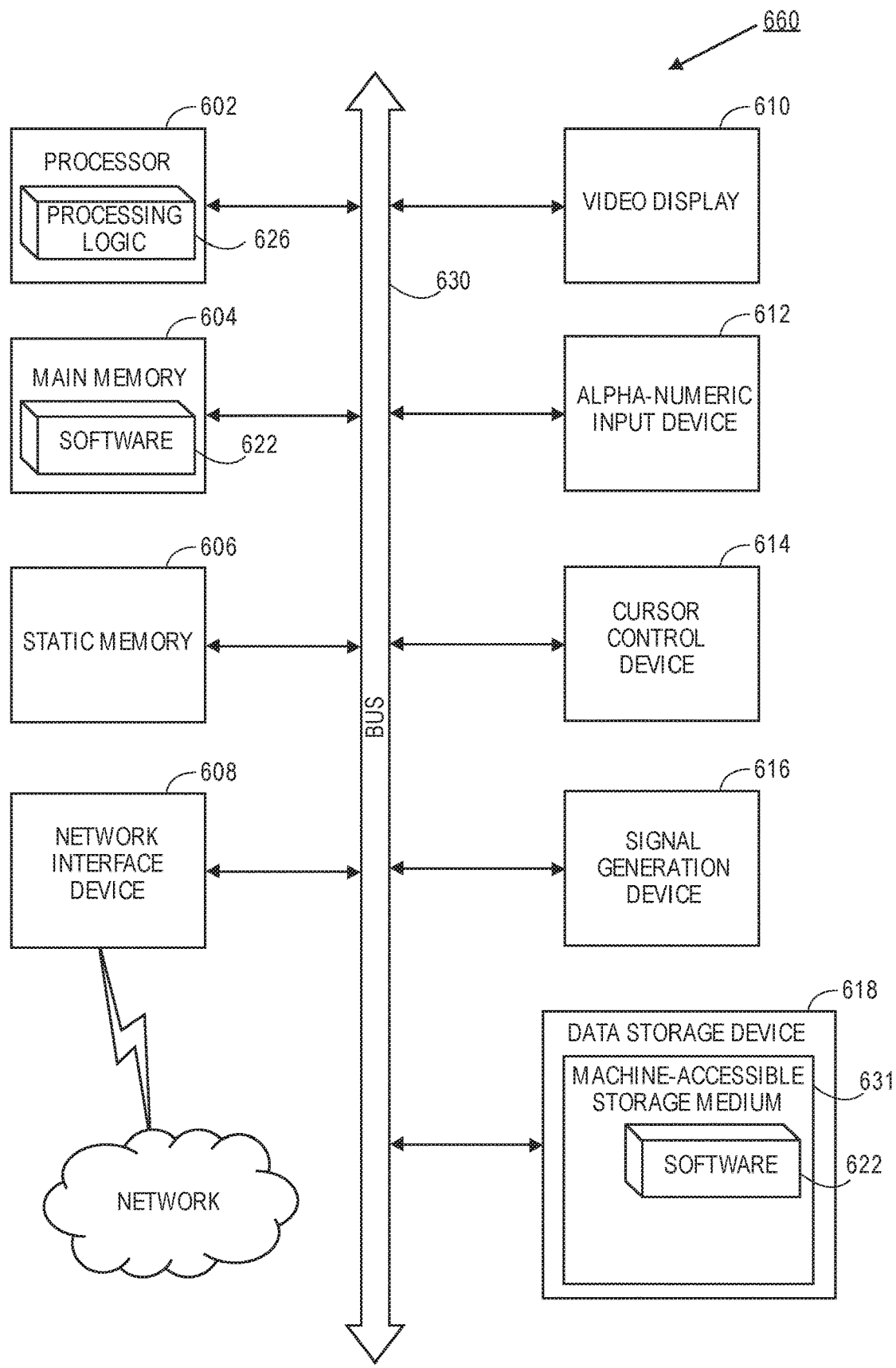
FIG. 6 illustrates a block diagram of an exemplary computer system that may be used in conjunction with a modular microwave radiation source, in accordance with an embodiment.

Referring now to FIG. 6, a block diagram of an exemplary computer system 660 of a processing tool 100 is illustrated in accordance with an embodiment. In an embodiment, computer system 660 is coupled to and controls processing in the processing tool 100. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A plasma processing chamber, comprising:
a dielectric body that forms a portion of an outer wall of the processing chamber, wherein the dielectric body comprises a first surface, a second surface opposite from the first surface, and a third surface between the first surface and the second surface;
an array of applicators, wherein each applicator comprises a dielectric resonant cavity and a monopole extending into a channel in the dielectric resonant cavity, wherein the dielectric resonant cavity comprises a dielectric material laterally surrounding sides of the monopole and beneath an end of the monopole, wherein a portion of the channel separates the end of the monopole from the dielectric material, wherein a position of the monopole is adjustable relative to a position of the dielectric resonant cavity, wherein each applicator is supported by the third surface, wherein a cross-section of a portion of the dielectric material of the dielectric resonant cavity proximate to the third surface is wider than a cross-section of a portion of the dielectric material of the dielectric resonant cavity proximate to the channel, and wherein the portion of the dielectric material of the dielectric resonant cavity proximate to the third surface has a symmetrical polygon shape in a first plane perpendicular to the monopole, and the portion of the dielectric material of the dielectric resonant cavity proximate to the channel has a circular shape in a second plane perpendicular to the monopole.

2. The plasma processing chamber of claim 1, wherein the channel is in an axial center of the dielectric resonant cavity.

3. The plasma processing chamber of claim 1, wherein the array of applicators includes applicators with non-uniform dimensions.

4. The plasma processing chamber of claim 1, wherein resonances of each of the applicators are substantially uniform.

5. The plasma processing chamber of claim 1, wherein the dielectric resonant cavity comprises a top surface, an outer sidewall surface and, a bottom surface opposite from the top surface;
and wherein the applicator further comprises:
an applicator housing formed around the outer sidewall surface of the dielectric resonant cavity; and
wherein a backshort has a top surface that at least partially faces the top surface of the dielectric resonant cavity so that a space is defined between the backshort and the dielectric resonant cavity, and wherein the backshort is arranged about at least a portion of the applicator housing and is configured to be repositioned along the applicator housing to change a distance between the top surface of the backshort and the top surface of the dielectric resonant cavity to adjust the space and thereby change an impedance of the applicator.

6. The plasma processing chamber of claim 1, wherein each of the applicators are independently controllable.

7. The plasma processing chamber of claim 1, further comprising:
an array of microwave amplification modules, wherein each microwave amplification module comprises a main amplifier and is coupled to at least one of the applicators in the array of applicators.

8. The plasma processing chamber of claim 7, further comprising:
a plurality of plasma sensors within the processing chamber, wherein the plasma sensors are communicatively coupled to the microwave amplification modules to provide feedback control.

9. The plasma processing chamber of claim 8, wherein feedback control data for each microwave amplification module is provided by one or more of the plurality of plasma sensors.

10. An array of microwave amplification modules for a plasma processing chamber, wherein each microwave amplification module comprises:
a voltage control circuit;
a voltage controlled oscillator, wherein an output voltage from the voltage control circuit drives oscillation in the voltage controlled oscillator; and
a solid state microwave amplification module coupled to the voltage controlled oscillator, wherein the solid state microwave amplification module amplifies an output from the voltage controlled oscillator, and wherein the solid state microwave amplification module comprises a dielectric resonant cavity and a monopole extending into a channel in the dielectric resonant cavity, wherein the dielectric resonant cavity comprises a dielectric material laterally surrounding sides of the monopole and beneath an end of the monopole, wherein a portion of the channel separates the end of the monopole from the dielectric material, wherein a cross-section of a portion of the dielectric material of the dielectric resonant cavity proximate to a bottom of the dielectric resonant cavity is wider than a cross-section of a portion of the dielectric material of the dielectric resonant cavity proximate to the channel, wherein the portion of the dielectric material of the dielectric resonant cavity proximate to the third surface has a symmetrical polygon shape in a first plane perpendicular to the monopole, and the portion of the dielectric material of the dielectric resonant cavity proximate to the channel has a circular shape in a second plane perpendicular to the monopole, and wherein a position of the monopole is adjustable relative to a position of the dielectric resonant cavity.

11. The array of microwave amplification modules of claim 10, wherein each microwave amplification module is independently controllable.

12. The array of microwave amplification modules of claim 10, wherein the individual microwave amplification modules are communicatively coupled to one or more sensors in the plasma processing chamber.

13. The array of microwave amplification modules of claim 12, wherein feedback control data for each microwave amplification module is provided by one or more of the sensors in the plasma processing chamber.

14. The array of microwave amplification modules of claim 10, wherein each microwave amplification module further comprises:
a circulator.

15. A plasma processing chamber, comprising:
an array of microwave amplification modules, wherein each microwave amplification module comprises:
a voltage control circuit;
a voltage controlled oscillator, wherein an output voltage from the voltage control circuit drives oscillation in the voltage controlled oscillator; and
a solid state microwave amplification module coupled to the voltage controlled oscillator, wherein the solid state microwave amplification module amplifies an output from the voltage controlled oscillator;
a dielectric body that forms a portion of an outer wall of the processing chamber, wherein the dielectric body comprises a first surface, a second surface opposite from the first surface, and a third surface between the first surface and the second surface; and
an array of applicators, wherein each applicator comprises a dielectric resonant cavity and a monopole extending into a channel in the dielectric resonant cavity, wherein the dielectric resonant cavity comprises a dielectric material laterally surrounding sides of the monopole and beneath an end of the monopole, wherein a portion of the channel separates the end of the monopole from the dielectric material, wherein a position of the monopole is adjustable relative to a position of the dielectric resonant cavity, wherein each applicator is supported by the third surface, wherein a cross-section of a portion of the dielectric material of the dielectric resonant cavity proximate to the third surface is wider than a cross-section of a portion of the dielectric material of the dielectric resonant cavity proximate to the channel, wherein the portion of the dielectric material of the dielectric resonant cavity proximate to the third surface has a symmetrical polygon shape in a first plane perpendicular to the monopole, and the portion of the dielectric material of the dielectric resonant cavity proximate to the channel has a circular shape in a second plane perpendicular to the monopole, and wherein each applicator is electrically coupled to one of the microwave amplification modules.

16. The plasma processing chamber of claim 15, further comprising:
a monopole antenna extending through an axial center of the dielectric resonant cavity.

17. The plasma processing chamber of claim 15, wherein the monopole antenna is provided in a channel in the dielectric resonant cavity.

18. The plasma processing chamber of claim 17, wherein an end of the monopole antenna is spaced away from a bottom of the channel.

19. The plasma processing chamber of claim 15, wherein the dielectric resonant cavity comprises a first portion with a first diameter, and a second portion with a second diameter that is smaller than the first diameter.

20. The plasma processing chamber of claim 15, wherein the dielectric body is wedge shaped.

* * * * *